United States Patent
Inoue et al.

(10) Patent No.: US 8,866,025 B2
(45) Date of Patent: Oct. 21, 2014

(54) MULTILAYER WIRING BOARD

(75) Inventors: Masahiro Inoue, Konan (JP); Hajime Saiki, Konan (JP); Atsuhiko Sugimoto, Kagamigahara (JP); Takuya Hando, Inuyama (JP); Hidetoshi Wada, Komaki (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 13/355,916

(22) Filed: Jan. 23, 2012

(65) Prior Publication Data

US 2012/0186863 A1 Jul. 26, 2012

(30) Foreign Application Priority Data

Jan. 24, 2011 (JP) ................................ 2011-011889
Nov. 30, 2011 (JP) ................................ 2011-262096

(51) Int. Cl.
*H05K 1/11* (2006.01)
*H05K 1/09* (2006.01)
*H01L 23/32* (2006.01)
*H01L 23/12* (2006.01)
*H05K 3/34* (2006.01)
*H05K 3/46* (2006.01)
*H05K 3/40* (2006.01)
*H05K 3/00* (2006.01)
*H01L 23/00* (2006.01)
*H05K 3/24* (2006.01)

(52) U.S. Cl.
CPC .............. *H05K 1/111* (2013.01); *H05K 3/3436* (2013.01); *H05K 3/4682* (2013.01); *H05K 3/4007* (2013.01); *H05K 3/0097* (2013.01); *H01L 24/00* (2013.01); *H01L 23/32* (2013.01); *H05K 1/113* (2013.01); *H01L 23/12* (2013.01); *H05K 3/244* (2013.01); *H05K 2201/09745* (2013.01)
USPC .......................................... 174/262; 174/257

(58) Field of Classification Search
USPC .................................... 174/257, 262
See application file for complete search history.

(56) References Cited

U.S. PATENT DOCUMENTS 5,006,922 A * 4/1991 McShane et al. .............. 257/697
5,538,433 A * 7/1996 Arisaka .......................... 439/70

(Continued)

FOREIGN PATENT DOCUMENTS

CN        1630454 A      6/2005
CN    101171894 A1      4/2008

(Continued)

OTHER PUBLICATIONS

SIPO, Notification of First Office Action issued in corresponding Chinese application 201210021585.6, issued Mar. 31, 2014.

*Primary Examiner* — William H Mayo, III
*Assistant Examiner* — Rhadames J Alonzo Miller
(74) *Attorney, Agent, or Firm* — Stites & Harbison PLLC; Jeffrey A. Haeberlin; Nicolo Davidson (57) ABSTRACT

A multilayer wiring board including a build-up layer comprising a conductor layer and a resin insulation layer that are alternately layered, conductive pads formed on a surface of a resin insulation layer so as to project from the surface, and a solder layer formed over an upper surface of each of the conductive pads is provided. The upper surface of the conductive pads may have a recess, and the entire surface of the solder layer may be situated at an elevated position with respect to an outer periphery portion of the upper surface.

4 Claims, 10 Drawing Sheets

(56) References Cited

U.S. PATENT DOCUMENTS

| | | | |
|---|---|---|---|
| 6,217,987 B1* | 4/2001 | Ono et al. | 428/209 |
| 7,597,929 B2 | 10/2009 | Kyozuka | |
| 7,882,626 B2 | 2/2011 | Murayama et al. | |
| 7,977,580 B2 | 7/2011 | Ueno et al. | |
| 2002/0066672 A1* | 6/2002 | Iijima et al. | 205/125 |
| 2005/0133249 A1 | 6/2005 | Fujii | |
| 2007/0096327 A1 | 5/2007 | Kawamura et al. | |
| 2007/0190237 A1 | 8/2007 | Kyozuka | |
| 2008/0258300 A1* | 10/2008 | Kobayashi et al. | 257/737 |
| 2009/0211798 A1* | 8/2009 | Horiuchi et al. | 174/262 |
| 2009/0223046 A1 | 9/2009 | Murayama et al. | |
| 2009/0243100 A1* | 10/2009 | Akiyama | 257/738 |
| 2009/0294156 A1 | 12/2009 | Ueno et al. | |
| 2009/0314537 A1* | 12/2009 | Hirose et al. | 174/263 |
| 2010/0052153 A1* | 3/2010 | Koizumi et al. | 257/697 |
| 2010/0155129 A1 | 6/2010 | Kawamura et al. | |
| 2011/0014826 A1* | 1/2011 | Lee et al. | 439/884 |
| 2011/0014827 A1* | 1/2011 | Oh et al. | 439/884 |
| 2011/0034022 A1* | 2/2011 | Nakamura | 438/613 |
| 2011/0061232 A1 | 3/2011 | Kawamura et al. | |
| 2011/0067899 A1* | 3/2011 | Choi et al. | 174/126.1 |
| 2011/0068473 A1* | 3/2011 | Lee et al. | 257/773 |
| 2011/0127676 A1* | 6/2011 | Choi et al. | 257/773 |
| 2012/0043653 A1* | 2/2012 | Oh et al. | 257/735 |
| 2012/0118620 A1* | 5/2012 | Baek et al. | 174/257 |
| 2012/0120623 A1* | 5/2012 | Baek et al. | 361/767 |
| 2012/0206891 A1* | 8/2012 | Yoshioka et al. | 361/783 |

FOREIGN PATENT DOCUMENTS

| | | |
|---|---|---|
| JP | 2007-214427 A | 8/2007 |
| JP | 2009-212140 A | 9/2009 |
| JP | 2009-289848 A | 12/2009 |

* cited by examiner

MULTILAYER WIRING BOARD

CROSS REFERENCE TO RELATED APPLICATIONS

The present application claims priority from Japanese Patent Application No. 2011-011889, which was filed on Jan. 24, 2011 and Japanese Patent Application No. 2011-262096, which was filed on Nov. 30, 2011, the disclosures of which are herein incorporated by reference in its entirety.

BACKGROUND OF THE INVENTION

1. Field of the Invention

The present invention relates to a multilayer wiring board. More particularly, certain embodiments of the present invention relate to multilayer wiring boards comprising conductive pads that have an upper surface that is recessed relative to the conductive pads' outer periphery portion.

2. Description of Related Art

A multilayer wiring board has generally been used as a package to be mounted with electronic components. In the multilayer wiring board, build-up layers are formed by stacking, one on top of the other, a resin insulation layer and a conductor layer on each side of a core board. In the multilayer wiring board, the core board is manufactured from, for instance, a resin including glass fibers, and plays a role of reinforcing the build-up layer by means of its high rigidity.

However, since core boards are thickly formed, core boards hinder miniaturization of the multilayer wiring boards. Further, wire length inevitably becomes longer since a through hole conductor for electrically interconnecting the build-up layers must be provided in the core board, which in turn may result in deterioration of high-frequency signal transmission performance.

Consequently, there has recently been developed a so-called coreless multilayer wiring board that is not provided with a core board and that has a structure suitable for miniaturization and enabling enhancement of high-frequency signal transmission performance (JP-A-2009-289848 and JP-A-2007-214427). In relation to such a coreless multilayer wiring board, a build-up layer is formed on a support whose surface is covered with, for instance, a peel sheet manufactured by layering two peelable metallic films one on top of the other. Subsequently, the build-up layer is separated from the support along a peel interface of the peel sheet, manufacturing the intended multilayer wiring board.

In the meantime, conductive pads that are situated on a semiconductor element mount area of the multilayer wiring board and that are intended to be connected to a semiconductor element through flip-chip bonding are formed beneath a resist layer that is located at the topmost level so as to become exposed through openings in the resist layer. Further, in some cases, the conductive pads are formed so as to protrude from the surface of the resist layer (JP-A-2009-212140). In such a case, when an attempt is made to feed solder paste to the conductive pads to thereby form a solder layer and bond a semiconductor element to the conductive pads by means of flip-chip bonding, the solder paste sometimes runs out from an upper surface of each of the conductive pads, which in turn hinders the solder layer from becoming sufficiently thick.

A defective connection to the semiconductor element or an insufficient thickness of the solder layer will consequently induce cracking, which in turn raises a problem of breakage of the solder layer.

BRIEF SUMMARY OF THE INVENTION

An objective of embodiments of the present invention is directed toward a multilayer wiring board including: a build-up layer made up of at least one conductor layer and at least one resin insulation layer that are layered one on top of the other; a conductive pad formed on a surface of at least the one resin insulation layer so as to protrude from the surface; and a solder layer formed over an upper surface of the conductive pad, wherein a sufficient amount of solder paste can be fed to and held on the upper surface of the conductive pad, thereby preventing occurrence of a defective connection to a semiconductor element and damage to the solder layer, which would otherwise be caused by an insufficient thickness of the solder layer.

In order to accomplish the objective, embodiments of the present invention relate to a multilayer wiring board comprising:

a build-up layer including a conductor layer and a resin insulation layer that are alternately layered;

a conductive pad that is formed so as to project from a surface of the resin insulation layer and that has an upper surface including an outer periphery portion and a center portion recessed relative to the outer periphery portion; and a solder layer that is formed on the conductive pad so that the solder layer over the upper surface of the conductive pad is situated above a level defined by the outer periphery portion.

According to embodiments of the present invention, the upper surface of the conductive pad projecting from the surface of the resin insulation layer, such as a resist layer situated at the topmost position, is formed in such a way that a center of the upper surface becomes recessed. Consequently, solder paste fed to the conductive pads is held in the recesses of the respective upper surfaces.

In other words, certain embodiments comprise a multilayer wiring board wherein the upper surface of the conductive pad forms a continual curved surface. Further embodiments comprise a multilayer wiring board wherein the solder layer covers a side surface of the conductive pad.

Accordingly, a sufficient thickness is held above the conductive pad of the formed solder layer. Consequently, problems like cracking, which may otherwise arise because of a defective connection to a semiconductor element or an insufficient thickness of the solder layer may be prevented.

The solder layer (e.g., the solder bumps) is formed by coating and printing the conductive pad with flux (e.g. solder paste) to, among other things, remove oxides. Subsequently, the solder paste is subjected to reflow processing. Furthermore, since the center of the conductive pad is recessed in embodiments of the present invention, a sufficient amount of flux can be held at the center of each conductive pad.

Moreover, in one embodiment of the present invention, the upper surface of the conductive pad makes up a continual curved surface. In this case, the recess at the center of each conductive pad can be easily formed, and also concentration of stress on an outer periphery, which would otherwise arise during formation of the solder layer and/or during flip-chip bonding of the multilayer wiring board to a semiconductor element, can be prevented. Infliction of damage to the outer periphery, namely the conductive pad, can be prevented.

Furthermore, in one example of the present invention, the solder layer is formed by covering a side surface of the conductive pad. In this case, when the thus-formed solder layer is subjected to reflow processing, an absolute amount of solder fed for flip-chip bonding of the multilayer wiring board to the semiconductor element can be increased, so that the aforementioned working effect can be yielded in a more noticeable manner.

JP-A-2010-226075 discloses a technique that is intended for forming a recess in the upper surface of each conductive pad and feeding solder paste in each of the recesses such that the thus-fed solder paste is held, thereby forming a junction layer for an electronic component, or the like. However, this technology relates to a wiring board incorporated in an electronic component. The conductive pads are provided for the purpose of establishing an electrical connection between an electronic component incorporated in a wiring board and the wiring board. For these reasons, the conductive pads are formed so as to project from a conductor pattern so as to prevent the electronic component from contacting the conductor pattern incorporated in the wiring board.

In the meantime, the present invention is directed toward a multilayer wiring board in which a semiconductor element is mounted on an exterior surface of the multilayer wiring board. Conductive pads that establish a connection are formed so as to project from at least one resin insulation layer located at the topmost layer of the multilayer wiring board. Consequently, the technique described in connection with embodiments of the present invention differs from the technique known in the art, which yields a differently shaped conductive pad.

Further, current technologies do not raise or alleviate any issues in relation to holding solder on the respective conductive pad. Specifically, current technologies do not address whether or not making a recess in an upper surface of each conductive pad poses influence on holding of solder.

Moreover, in one embodiment of the present invention, the multilayer wiring board further comprises a barrier metal layer formed between the conductive pad and the solder layer so as to cover the conductive pad, wherein the solder layer covers the conductive pad and the barrier metal layer that covers the conductive pad in its entirety, and wherein a coating thickness of the barrier metal layer formed on a side end face of the conductive pad situated on the resin insulation layer can be made greater than a coating thickness of the barrier metal layer formed on a surface of the conductive pad situated at a higher position than the side end face. The barrier metal layer may cover the entire conductive pad.

As mentioned above, when the solder layer is formed so as to cover the conductive pad in its entirety, adhesion between the solder layer and the resin insulation layer, particularly adhesion between the solder layer and the resist layer, is often considerably low. Therefore, peeling takes place between the solder layer and the resin insulation layer prior to or subsequent to flip-chip bonding of the multilayer wiring board to the semiconductor element, which often causes a defective connection to a semiconductor element, or the like.

However, when the barrier metal layer is formed between the conductive pad and the solder layer as mentioned above, adhesion of the barrier metal layer to the resin insulation layer is sufficiently higher than adhesion of the solder layer to the resin insulation layer. The coating thickness of the barrier metal layer formed on the side end face of each conductive pad situated on the resin insulation layer is made greater than the coating thickness of the barrier metal layer formed over the surface of the conductive pad formed at a higher position with respect to the side end face. Accordingly, foregoing enhancement of adhesion becomes more noticeable.

Consequently, peeling is reduced or eliminated between the barrier metal layer and the resin insulation layer prior to and subsequent to flip-chip bonding of the multilayer wiring board to the semiconductor element. As a consequence, peeling also is minimized or reduced between the solder layer and the resin insulation layer, too. For these reasons, occurrence of a defective connection to a semiconductor element, or the like, can be prevented.

So long as the solder layer is formed only over the barrier metal layer to prevent the solder layer from contacting the resin insulation layer, an end of the solder layer remaining in contact with the resin insulation layer, for instance, can be prevented from being partially peeled.

As mentioned above, embodiments of the present invention make it possible to prevent occurrence of a defective connection to a semiconductor element and damage to a solder layer, which would otherwise be caused by an insufficient thickness of the solder layer, with a multilayer wiring board including: a build-up layer made up of at least one conductor layer and at least one resin insulation layer that are layered one on top of the other; a conductive pad formed on a surface of at least the one resin insulation layer so as to protrude from the surface; and a solder layer formed over an upper surface of the conductive pad, wherein a sufficient amount of solder paste can be fed to and held on the upper surface of the conductive pad.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Embodiments of the present invention are now hereunder described by reference to the drawings.

Multilayer Wiring Board

Figure 1:
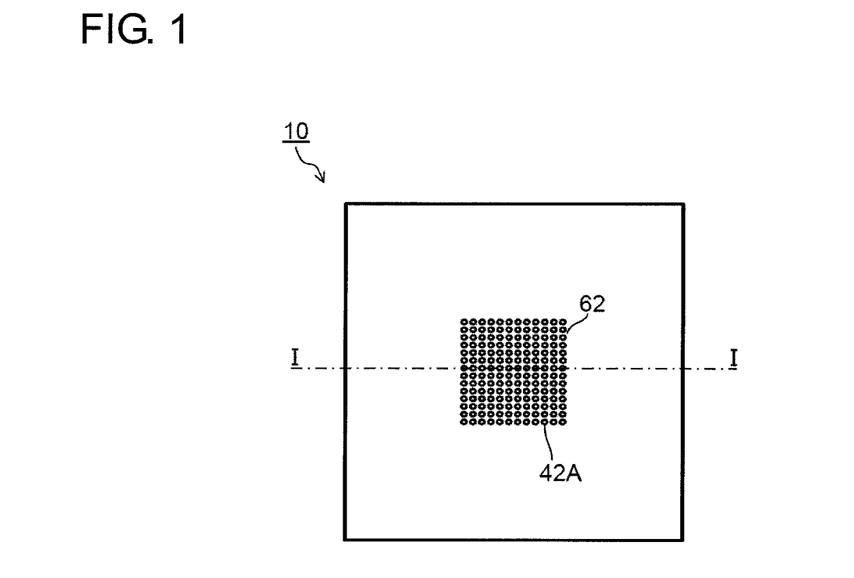
FIG. 1 is a plan view of a multilayer wiring board of a first embodiment of the present invention.
Figure 2:
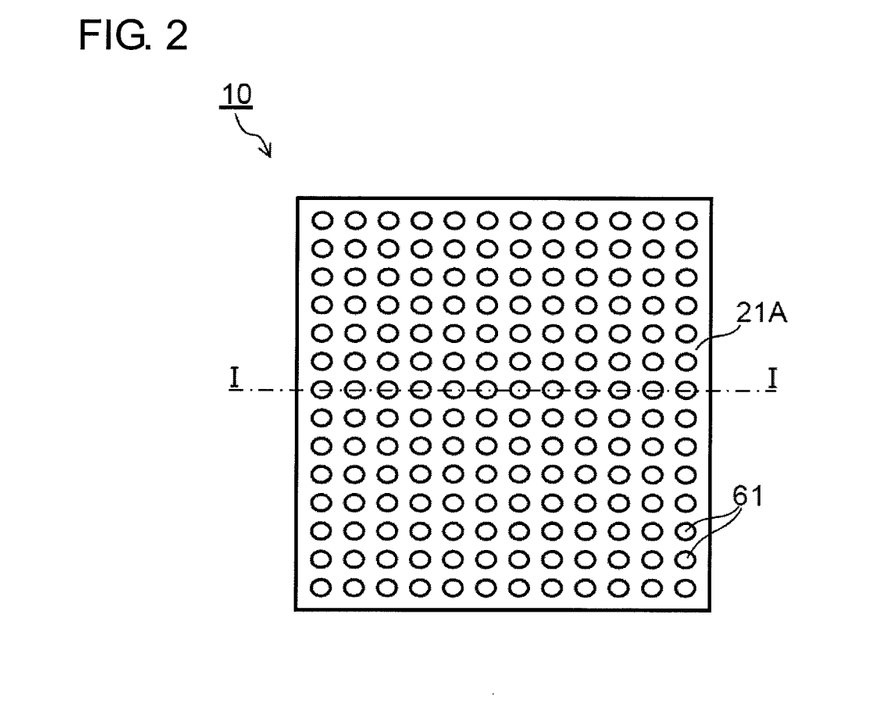
FIG. 2 is a plan view of the multilayer wiring board of the first embodiment of the present invention.
Figure 3:
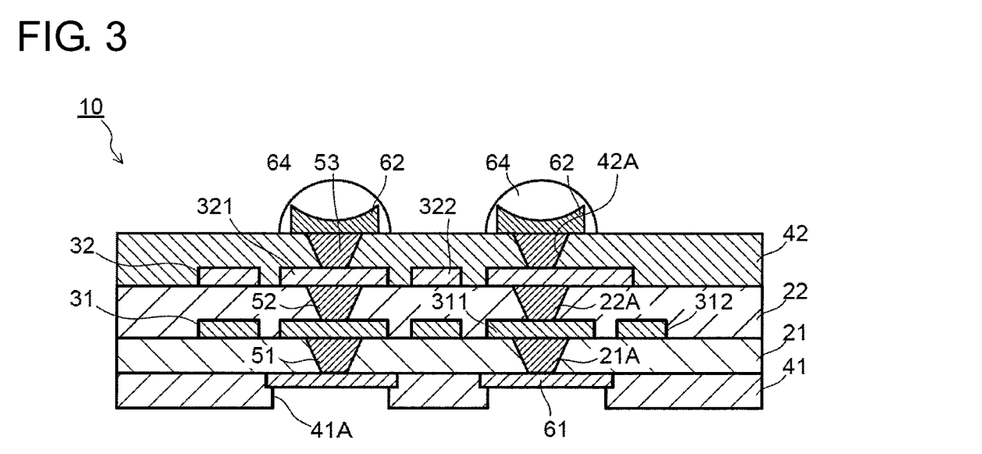
FIG. 3 is an enlarged cross sectional view showing a portion of the multilayer wiring board that is shown in FIGS. 1 and 2 and that is taken along line I-I.
Figure 4:
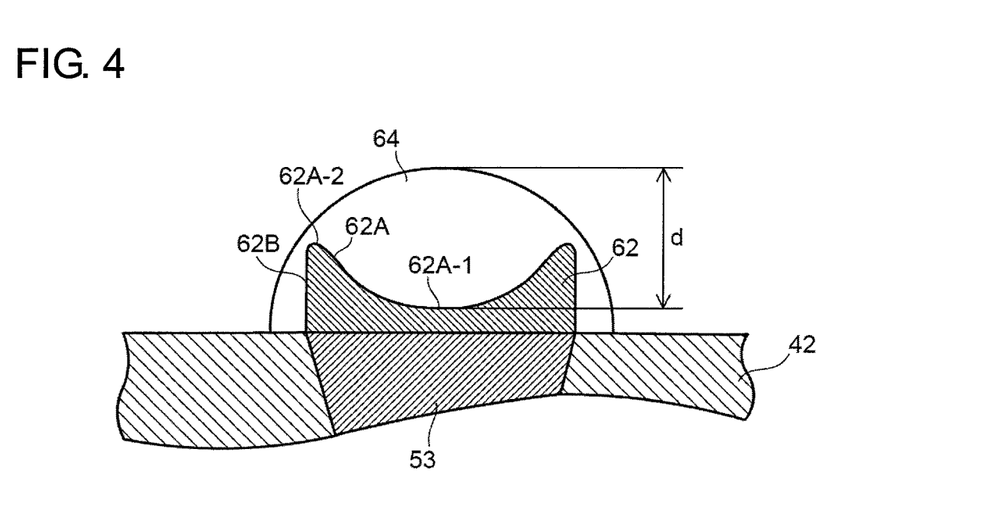
FIG. 4 is an enlarged cross sectional view showing a neighborhood of the conductive pad shown in FIG. 3.

FIGS. 1 and 2 are plan views of a multilayer wiring board of a first embodiment of the present invention. FIG. 1 shows a state of the multilayer wiring board when viewed from above. FIG. 2 shows a state of the multilayer wiring board when viewed from below. FIG. 3 is a drawing showing, in an enlarged manner, a portion of a cross section of the multilayer wiring board that is shown in FIGS. 1 and 2 and that is taken along line I-I. FIG. 4 is an enlarged cross sectional view showing the conductive pad shown in FIG. 3.

The multilayer wiring board described below is an exemplary embodiment that illustrates certain characteristics of the present invention. No specific limitations are imposed on the multilayer wiring board, so long as the multilayer wiring board includes a build-up layer made up of a conductor layer and a resin insulation layer layered one on top of the other; a conductive pad that is formed on a surface of the resin insulation layer so as to protrude from the surface and that has a center indented upper surface; and a solder layer formed on the upper surface of the conductive pad in such a way that an entire surface of the solder layer situates at a position higher than a surface level defined by an outer edge of the upper surface of the conductive pad.

In a multilayer wiring board 10 shown in FIGS. 1 through 3, a first resin insulation layer 21 and a second resin insulation layer 22 that are formed from a thermosetting resin composition including, as required, a silica filler, and first conductor layers 31 and second conductor layers 32 that are formed from an electrical conductor, like copper, into respective predetermined patterns are stacked one on top of the other. A first resist layer 41 that includes openings 41A and that is formed from, for instance, an epoxy-based resist material, is formed over the first resin insulation layer 21. A second resist layer 42 that includes openings, or via holes 42A, and that is formed from, for instance, an epoxy-based resist material, is formed over the second resin insulation layer 22.

At least the first resist layer 41, the first resin insulation layer 21, the first conductor layers 31, the second resin insulation layer 22, the second conductor layers 32, and the second resist layer 42, which are stacked one on top of the other, make up a build-up layer.

Openings, namely via holes 21A and 22A, are respectively formed in the first resin insulation layer 21 and the second resin insulation layer 22 so as to penetrate through the respective resin insulation layers in their thicknesswise direction. Further, via conductors 51 and 52 are formed so as to bury the via holes 21A and 22A. The via conductor 52 electrically connects the first conductor layer 31 to the second conductor layer 32.

In this case, areas 311 of the first conductor layers 31 remaining in electrical contact with the respective via conductors 51 make up via lands. Areas 312 of the first conductor layers 31 remaining out of electrical contact with the via conductors 51 make up an interconnection layer. Likewise, areas 321 of the second conductor layers 32 remaining in electrical contact with the via conductors 52 make up via lands, and areas 322 remaining out of electrical contact with the via conductors 52 make up an interconnection layer.

First conductive pads 61 formed on the first resin insulation layer 21 remain exposed through the respective openings 41A of the first resist layer 41. The first conductor layers 31 and the first conductive pads 61 are electrically connected by means of the via conductors 51.

The first conductive pads 61 are utilized as backside lands (e.g., LGA pads) for connecting the multilayer wiring board 10 to a motherboard and arranged in a rectangular pattern on a back side of the multilayer wiring board 10.

Via conductors 53 are formed within the respective via holes 42A of the second resist layer 42 in such a way that the via holes 42A are buried. Further, raised second conductive pads 62 are formed so as to project from a surface of the second resist layer 42 and continue from the via conductors 53. The second conductor layers 32 and the conductive pads 62 are electrically connected together by means of the via conductors 53.

The second conductive pads 62 are pads (e.g., FC pads) for flip-chip connection with an unillustrated semiconductor element and make up a semiconductor element mount area. The second conductive pads 62 are arranged in a rectangular pattern at a substantial center of the surface of the multilayer wiring board 10.

As is apparent from the above descriptions, the first conductive pads 61, the first conductor layers 31, the second conductor layers 32, and the second conductive pads 62 are electrically connected together in a thicknesswise direction of the multilayer wiring board 10 by means of the via conductors 51, 52, and 53.

As shown in FIGS. 3 and 4, an upper surface 62A of each of the second conductive pads 62 has a recessed center portion 62A-1 and makes up a continual, concave curve. The upper surface 62A is formed so as to assume a semi-circular cross section curved in such a way that the center of curvature comes to a higher position above the upper surface 62A (a so-called cone shape). A solder layer 64 formed from solder paste that does not substantially include Pb, for instance, Sn—Bi, Sn—Ag, Sn—Cu, Sn—Ag—Cu, and Sn—Sb, is made so as to cover the upper surface 62A and a side surface 62B.

The multilayer wiring board 10 can be formed to a size of, for instance, 200 mm×200 mm×0.8 mm.

As shown in FIGS. 3 and 4, the second conductive pads 62 are formed so as to project from the surface of the second resist layer 42. For instance, in a case where each of the second conductive pads 62 assumes, for instance, a plate-like shape in the same manner as does each of the first conductive pads 61, and where an upper surface of the second conductive pad 62 is flat, if a try is made to form a solder layer for connecting an unillustrated semiconductor element through flip-chip bonding by means of feeding solder, solder will flow out from the upper surface of each conductive pad, which will in turn hinder formation of a solder layer having a sufficient thickness. As a consequence, a defective connection to a semiconductor element and a deficiency in thickness of the solder layer may induce cracking, which in turn causes problems, such as breakage of the solder layer.

In the meantime, in the present embodiment, the upper surface 62A of each of the second conductive pads 62 projecting from the surface of the second resist layer 42 is formed so as to have the recessed center portion 62A-1; namely, a semi-circular cross section curved in such a way that the center of curvature comes to a higher position above the upper surface 62A. Consequently, the solder paste fed to the second conductive pads 62 is held in the recesses of the respective upper surfaces 62A. Hence, the resultantly-formed solder layer 64, particularly a portion of the solder layer 64 located above the recess of the upper surface 62A, is held to a sufficient thickness. Therefore, occurrence of problems, such as cracking or breakage of a solder layer, which would otherwise be caused by a defective connection to a semiconductor element and a deficiency in thickness of a solder layer, are prevented.

The solder layer 64 may be formed by applying and feeding (e.g., printing) a flux for removing oxides onto each of the second conductive pads 62, feeding solder paste to each of the second conductive pads 62, and subjecting the solder paste to reflow. In certain embodiments, since the center portion 62A-1 of each of the second conductive pads 62 is recessed, the center portion 62A-1 can hold a sufficient quantity of flux.

No specific limitations are imposed on a thickness "d" of the portion of the solder layer 64 held on the upper surface 62A of each of the second conductive pads 62, so long as the aforementioned working-effects can be yielded. However, the thickness may be set to, for instance, three micrometers to 50 micrometers. The working effects can thereby be noticeably yielded. If the solder paste is fed and held on the upper surface 62A of each of the conductive pad 62 in such a way that the entire surface of the solder layer 64 upwardly projects from a surface level defined by an outer periphery portion 62A-2, the foregoing working effects can be yielded.

Figure 5:
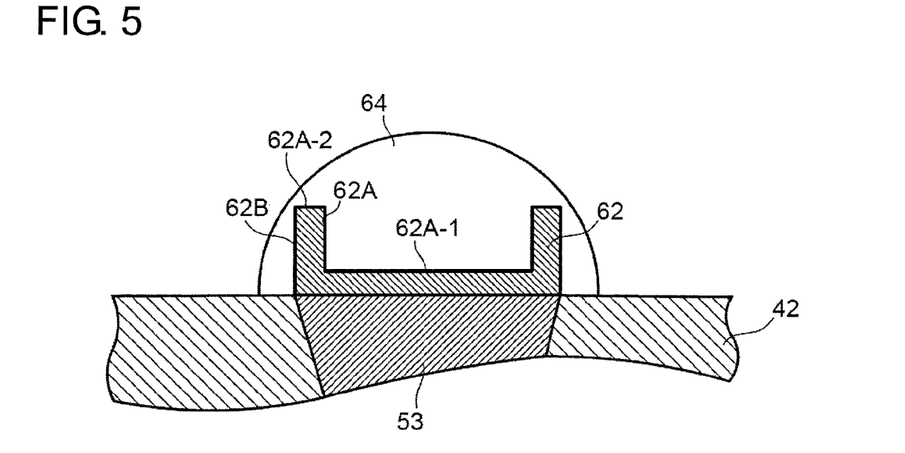
FIG. 5 is an enlarged cross sectional view showing an embodiment of a conductive pad.

As shown in FIG. 4, in the present embodiment, the upper surface 62A of the second conductive pad 62 is formed so as to have a continual curve and assume a semicircular cross section curved so as to have a center of curvature at a higher position above the upper surface 62A. If the center portion 62A-1 is recessed and if the solder paste can be held so as to meet the requirements, no specific limitations are imposed on the shape of the upper surface. For instance, as shown in FIG. 5, the upper surface 62A can also be formed in such a way that the center portion 62A-1 thereof is recessed in a rectangular shape.

The recess of the upper surface 62A of each of the second conductive pads 62 can be formed by controlling a plating time consumed during formation of the second conductive pads 62 and an additive contained in a plating fluid. For instance, the recess can be formed by shortening the plating time so as to become shorter than a plating time required to form a plating film having a predetermined thickness.

However, the recess of the center portion 62A-1 can readily be formed by adopting a curved shape, such as that shown in the embodiment. Further, concentration of stress on the outer periphery portion 62A-2, which would otherwise occur during formation of the solder layer 64 and/or flip-chip bonding of the solder layer to a semiconductor element, can be prevented, whereby breakage of the outer periphery portion 62A-2, and namely breakage of the second conductive pads 62, can be prevented.

In the embodiment, the solder layer 64 is formed so as to cover the side surface 62B as well as the upper surface 62A of each of the second conductive pads 62. Therefore, when the solder layer 64 is subjected to reflow processing, an absolute quantity of solder fed to flip-chip bonding of the solder layer to a semiconductor element can be increased, so that the working effects can be yielded more noticeably.

Method for Manufacturing a Multilayer Wiring Board

A method for manufacturing the multilayer wiring board 10 shown in FIGS. 1 through 4 is now described. FIGS. 6 through 15 show views of an embodiment of a multilayer wiring board 10 at different stages of manufacture.

Figure 6:
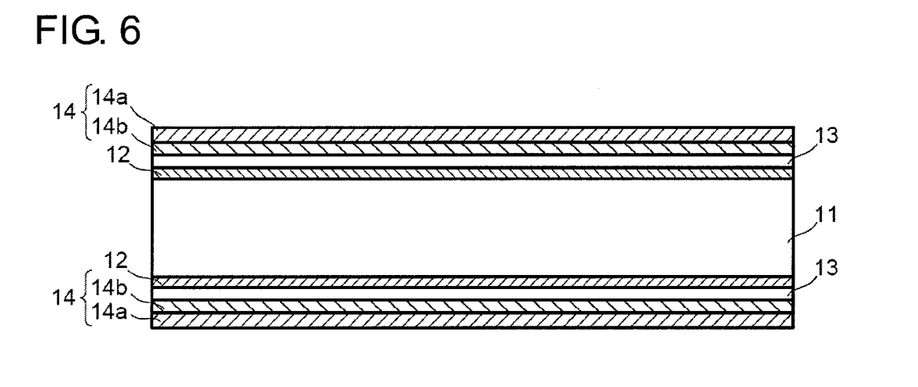
FIG. 6 shows an embodiment of the present invention at a particular stage of manufacture.

First, a support board 11 having on each side thereof a copper foil 12 is prepared as shown in FIG. 6. The support board 11 can be formed from, for instance, a heat resistant resin board (e.g., a bismaleimide triazine resin board) and a fiber reinforced resin plate (e.g., a glass fiber reinforced epoxy resin plate), or the like. Next, by way of a prepreg layer 13 serving as an adhesive layer, a peel sheet 14 is formed through pressure bonding over the copper foil 12 laid on each side of the support board 11 by means of, for instance, vacuum heat pressing.

The peel sheet 14 is formed from, for instance, a first metallic film 14a and a second metallic film 14b, and a space between the first metallic film 14a and the second metallic film 14b is plated with Cr, or the like, so that they can be peeled off from each other by means of external tensile force. The first metallic film 14a and the second metallic film 14b can be formed from copper foil.

Figure 7:
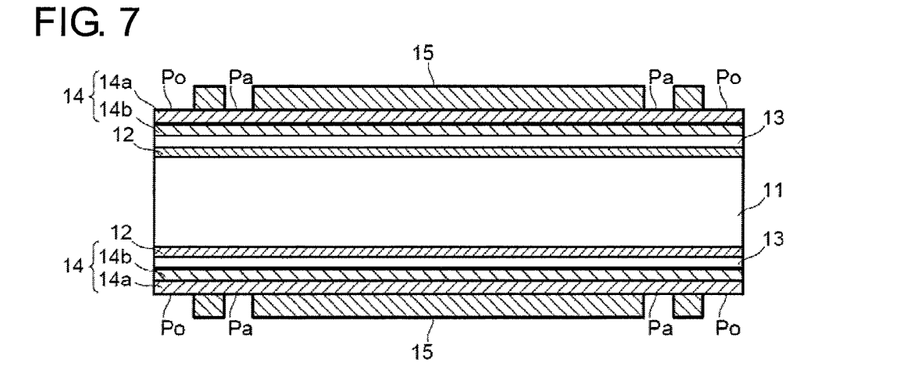
FIG. 7 shows an embodiment of the present invention at a particular stage of manufacture.

Next, as shown in FIG. 7, a photosensitive dry film is layered on the peel sheet 14 laid on either side of the support board 11 and subjected to exposure and development, thereby forming mask patterns 15. Openings equivalent to alignment mark formation portions Pa and outer periphery definition portions Po are formed in each of the mask patterns 15.

Figure 8:
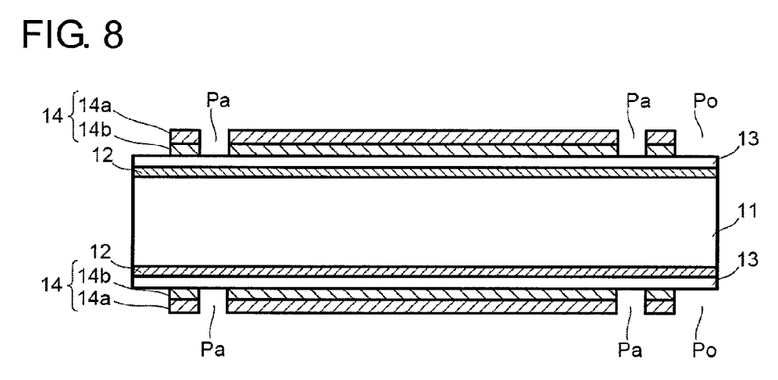
FIG. 8 shows an embodiment of the present invention at a particular stage of manufacture.
Figure 9:
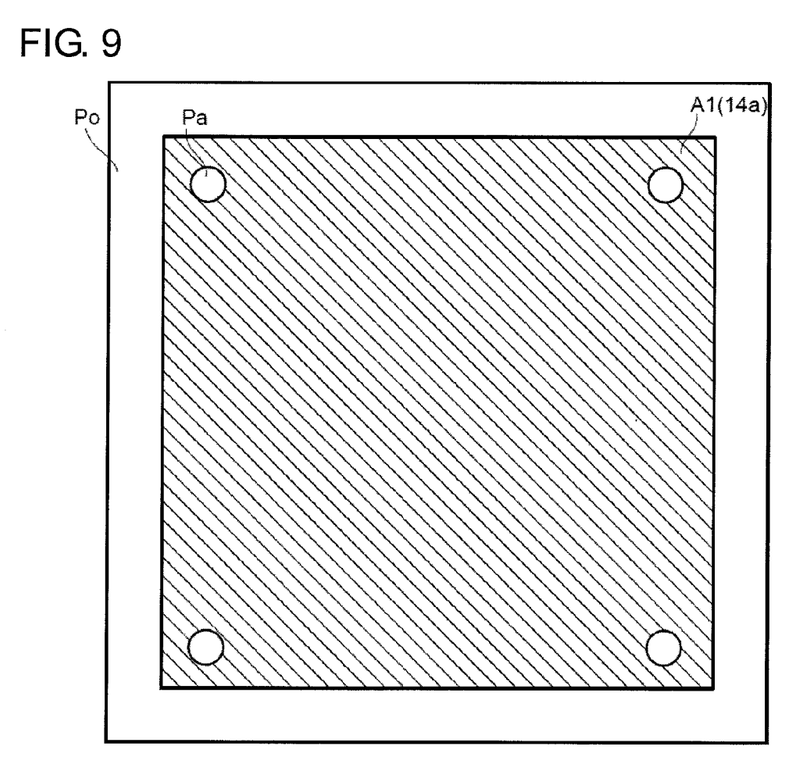
FIG. 9 shows an embodiment of the present invention at a particular stage of manufacture.

As shown in FIG. 8, the peel sheet 14 on either side of the support board 11 is etched by way of the mask pattern 15, thereby forming the alignment mark formation portions Pa and the outer periphery definition portions Po at positions equivalent to the respective openings of the peel sheet 14. FIG. 9 is a plan view achieved when the assembly shown in FIG. 8 is viewed from above. The alignment mark formation portions Pa are formed as openings in each of the peel sheets 14 so as to make the prepreg 13 exposed. Further, the outer periphery definition portions Po are formed as cutouts that are made by cutting edges of each of the peel sheets 14 so that the prepreg 13 will become exposed.

After formation of the alignment mark formation portions Pa and the outer periphery definition portions Po, the mask patterns 15 are etched away.

It is preferable that surfaces of the respective peel sheets 14 exposed after removal of the respective mask patterns 15 should be roughened by means of etching. Adhesion between each peel sheet 14 and a resin layer to be described later can thereby be enhanced.

Figure 10:
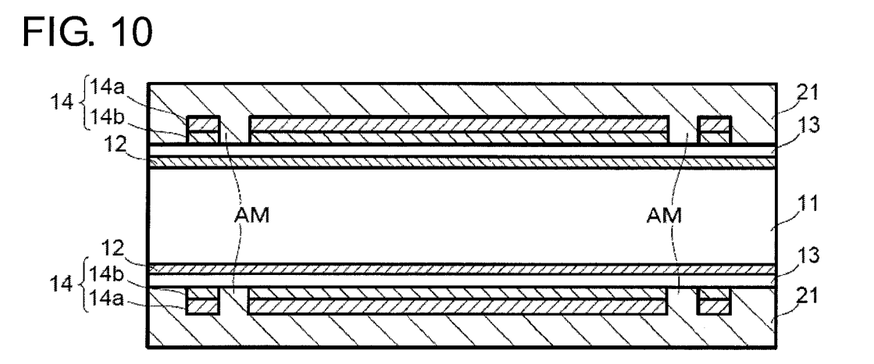
FIG. 10 shows an embodiment of the present invention at a particular stage of manufacture.

As shown in FIG. 10, a resin film is layered on each peel sheet 14 and pressurized and heated in a vacuum, to thus be cured. The first resin insulation layers 21 are thus formed. Each of the surfaces of the respective peel sheets 14 is thereby covered with the first resin insulation layer 21. The openings making up the respective alignment mark formation portions Pa and the cutouts making up the outer periphery definition portions Po are filled with the first resin insulation layer 21. A structure of an alignment mark AM is formed in each of the alignment mark formation portions Pa.

The outer peripheral definition portions Po are also covered with the first resin insulation layer 21. Therefore, the occurrence of the following disadvantages can be eliminated. Namely, in a process for performing the peeling operation by means of the peel sheets 14, which are described below, end faces (i.e., end portions, periphery) of each peel sheet 14 will come off (become detached) from, for instance, the respective prepregs 13 (i.e., to thus be uplifted or turned up at the periphery). This will make it difficult to perform processing pertaining to the peel process without fail, so that manufacture of the intended multilayer wiring board 10 is difficult or not possible.

Figure 11:
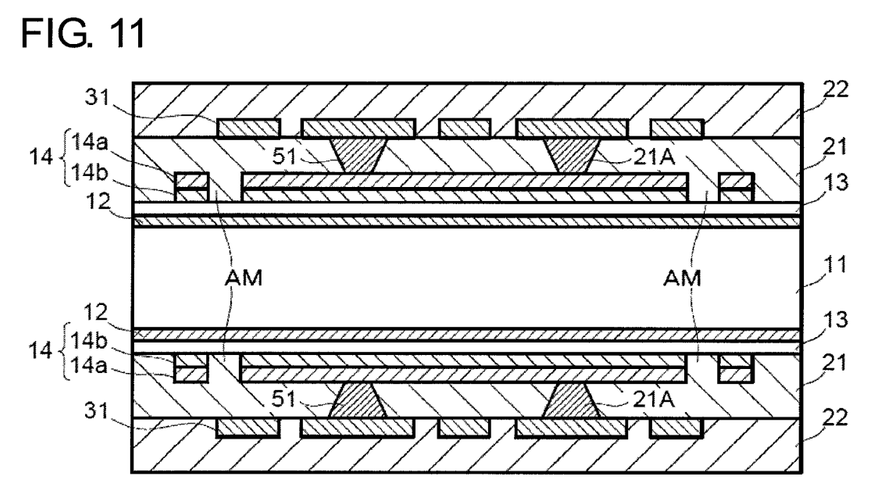
FIG. 11 shows an embodiment of the present invention at a particular stage of manufacture.

Next, as shown in FIG. 11, the first resin insulation layers 21 are exposed to a laser beam that has predetermined intensity and that originates from, for instance, a $CO_2$ gas laser or a YAG laser, to thus make the via holes 21A. Subsequently, the first resin insulation layers 21 including the via holes 21A are subjected to roughening. When the first resin insulation layers 21 include a filler, the filler will be liberated and left on the first resin insulation layer 21 if the first resin insulation layers 21 are subjected to roughening. Accordingly, the first resin insulation layers 21 are rinsed with water, as required.

The via holes 21A are then subjected to desmearing and outline etching, whereupon interiors of the respective via holes 21A are rinsed. When rinsing is implemented as mentioned above, the filler, which would otherwise still remain on the resin insulation layers 21 during water rinsing in the desmearing process, can be removed.

Air blow processing can be performed between the rinsing operation and the desmearing operation. Even when the isolated filler is not perfectly removed by water rinsing, elimination of the filler can be complemented by means of air blowing.

Subsequently, the first resin insulation layer 21 is subjected to pattern plating, thereby forming the first conductor layers 31 and the via conductors 51. The first conductor layers 31 and the via conductors 51 are formed as follows by means of a semi-additive technique. First, an electroless plating film is formed over each of the first resin insulation layers 21. Subsequently, a resist is then formed over the electroless plating film. An area on each first resin insulation layer 21 where the resist is not formed is subjected to electrolytic copper plating. After the first conductor layers 31 and the via conductors 51 have been formed, the resist is peeled and eliminated by means of KOH, or the like.

Next, after each of the first conductor layers 31 is subjected to roughening, a resin film is layered over each of the first resin insulation layers 21 so as to cover the first conductor layer 31. The thus-layered films are then pressurized and heated in a vacuum, to thus become cured. The second resin insulation layers 22 are then formed.

Figure 12:
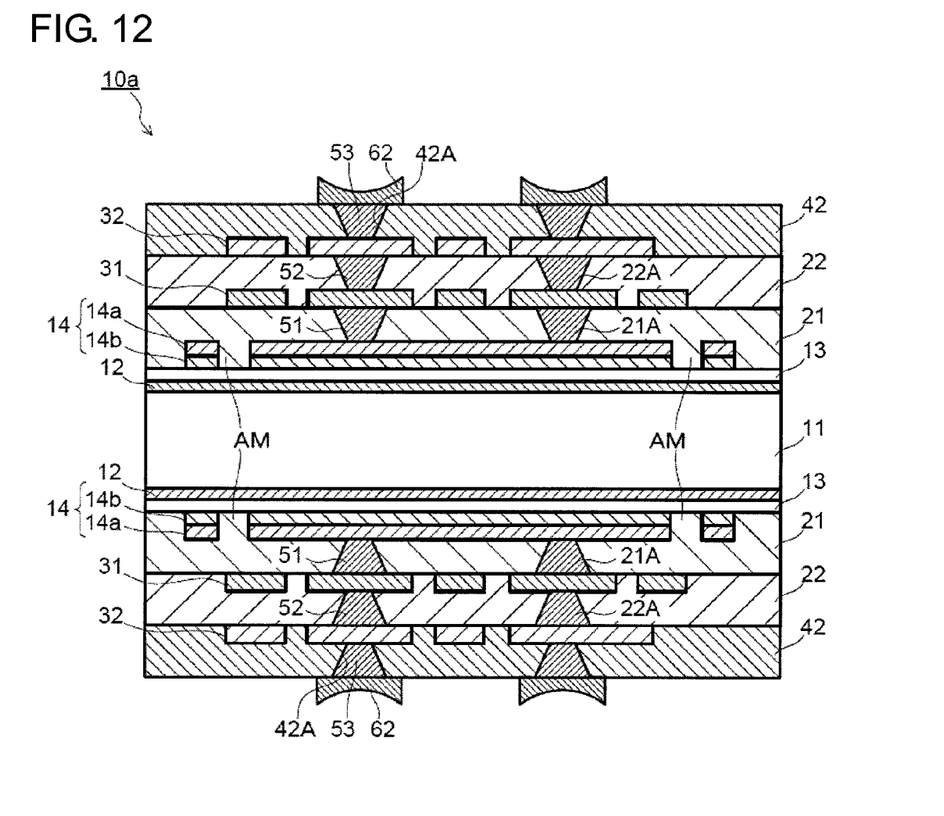
FIG. 12 shows an embodiment of the present invention at a particular stage of manufacture.

As shown in FIG. 12, the second resin insulation layers 22 are exposed to a laser beam that originates from, for instance, a $CO_2$ gas laser or a YAG laser that has a predetermined intensity, to make the via holes 22A. Subsequently, the second resin insulation layers 22 including the via holes 22A are subjected to roughening. When the second resin insulation layers 22 include a filler, the filler will be isolated and left on the second resin insulation layers 22 if the second resin insulation layers 22 are subjected to roughening. Therefore, the second resin insulation layers 22 are rinsed with water, as required.

The via holes 22A are then subjected to desmearing and outline etching, whereupon interiors of the respective via holes 22A are rinsed. When water rising is implemented as mentioned above, the filler, which would otherwise remain on the second resin insulation layers 22 during water rinsing in the desmearing process, can be removed.

Air blow processing can be performed between the rinsing operation and the desmearing operation. Even when the isolated filler is not perfectly removed by water rinsing, elimination of the filler can be complemented by means of air blowing.

Subsequently, the second resin insulation layer 22 is subjected to pattern plating by means of the semi-additive technique, thereby forming the second conductor layers 32 and the via conductors 52, in much the same way as are the first conductor layers 31.

The second resist layer 42 is formed over the respective second resin insulation layers 22. Each of the second resist layers 42 is subjected to exposure and development by way of a predetermined mask, thereby forming the openings 42A. Subsequently, the second conductive pads 62 and the via conductors 53 are formed by means of a semi-additive technique, as in the case of the first conductor layers 31.

Since the center portion 62A-1 in the upper surface 62A of each of the second conductive pads 62 must be recessed, the recess is formed by controlling a plating time consumed during formation of the second conductive pads 62 or an additive to be included in a plating fluid. For instance, the recess can be formed by shortening the plating time so as to become shorter than a plating time required to form a plating film having a predetermined thickness.

Figure 13:
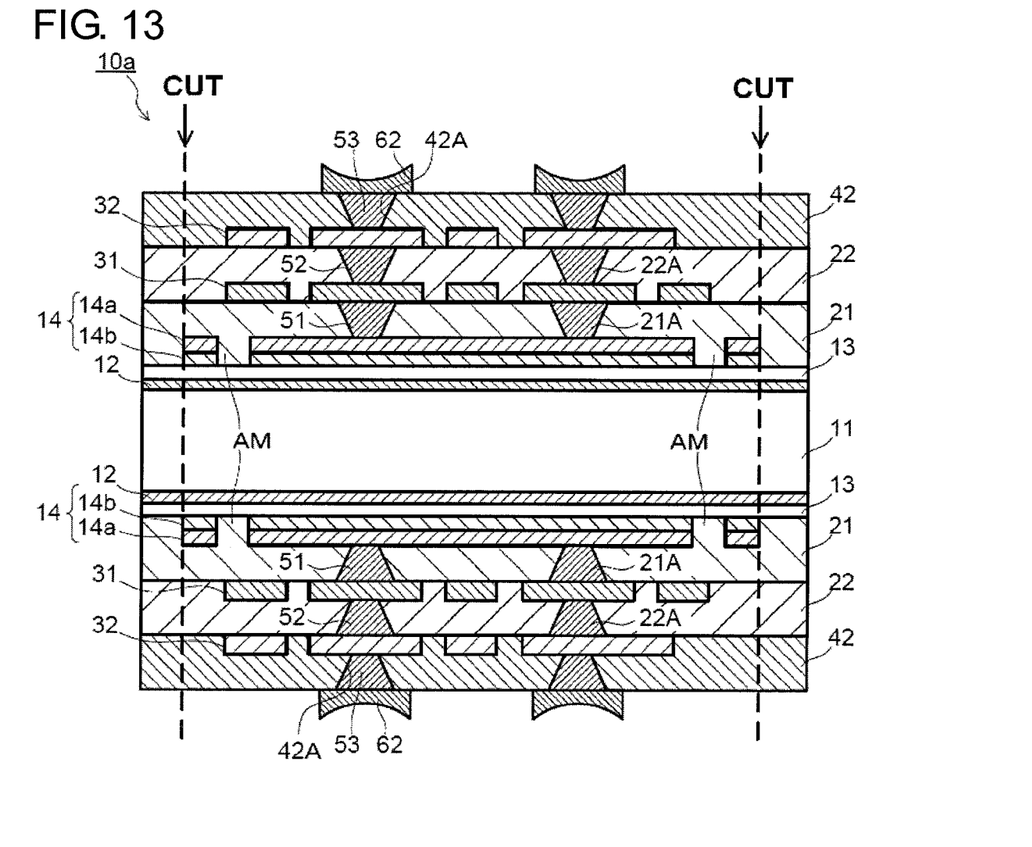
FIG. 13 shows an embodiment of the present invention at a particular stage of manufacture.

As shown in FIG. 13, a layered product 10a manufactured through the foregoing processes is cut along a cut line set slightly inside with reference to each of the outer periphery definition portion Po, thereby eliminating an unwanted outer periphery from the layered product 10a. An effective area for a multilayer wiring board is thus defined.

Figure 14:
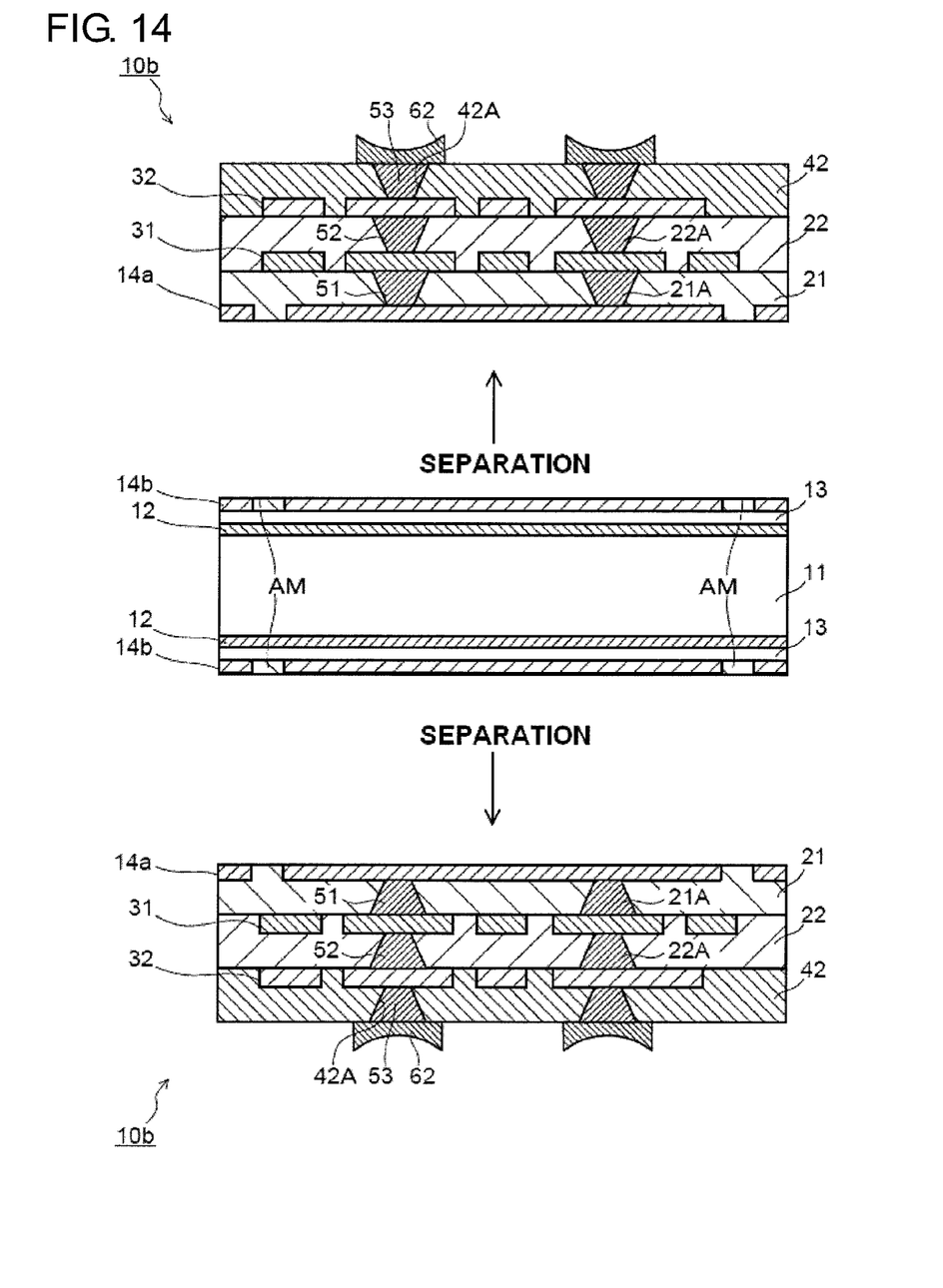
FIG. 14 shows an embodiment of the present invention at a particular stage of manufacture.

Next, after the unwanted outer periphery has been removed with reference to each of the outer periphery definition portion Po as shown in FIG. 14, the layered product 10a is peeled along a peel interface between the first metallic film 14a and the second metallic film 14b that make up the peel sheet 14 of the layered product 10a, whereby the support board 11 is eliminated from the layered product 10a. The layered products 10b having the same structure, such as those shown in FIG. 14 are obtained.

Figure 15:
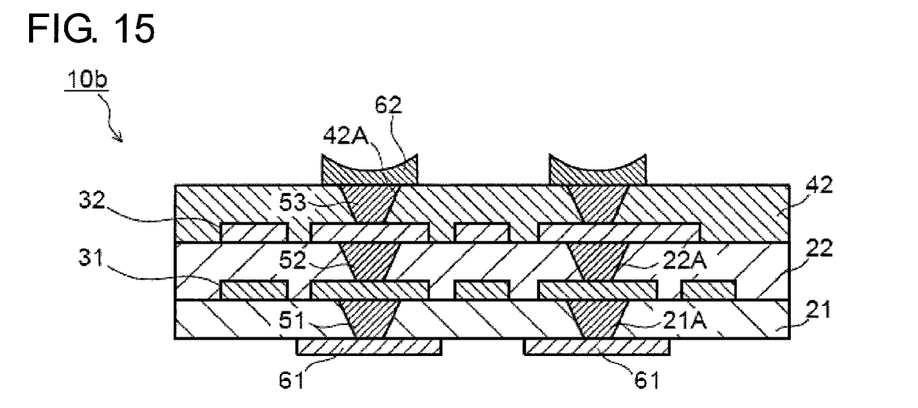
FIG. 15 shows an embodiment of the present invention at a particular stage of manufacture.

Subsequently, as shown in FIG. 15, the first metallic film 14a of the peel sheet 14 still remaining below the layered product 10b is etched, thereby forming the first conductive pads 61 on the first resin insulation layer 21. The first resist layer 41 including the openings 41A, like openings through which the first conductive pads 61 become exposed, is formed. Further, the solder layer 64 is formed so as to cover the second conductive pads 62 in their entirety, whereby the multilayer wiring board 10, such as that shown in FIGS. 1 through 4, is obtained.

The alignment marks AM can be used as positional references at the time of formation of, for instance, the first resist layer 41.

In the present embodiment, the alignment marks AM are formed in the process of manufacturing the multilayer wiring board 10. However, the alignment marks AM are not necessarily required. Further, the alignment marks AM can also be formed by means of machining (e.g., drilling) the peel sheet 14, instead of etching the peel sheet 14 as in the present embodiment.

Multilayer Wiring Board

Figure 16:
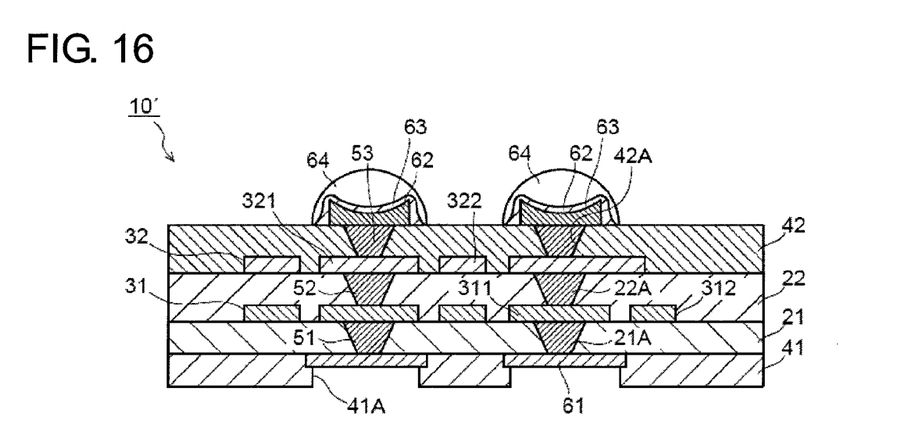
FIG. 16 is an enlarged cross sectional view of a portion of a multilayer wiring board of a second embodiment of the present invention.
Figure 17:
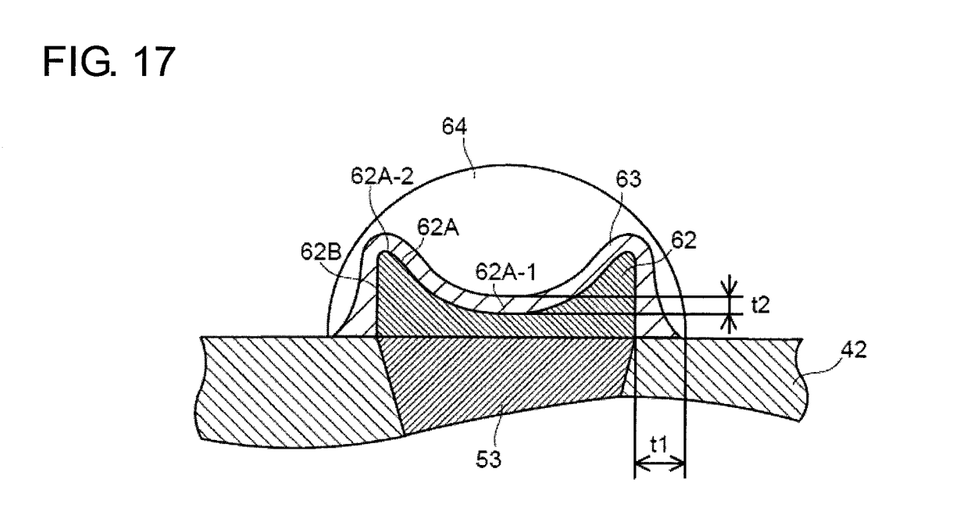
FIG. 17 is an enlarged cross sectional view showing a neighborhood of the conductive pad shown in FIG. 16.

FIG. 16 is an enlarged view of a portion of a cross section of a multilayer wiring board of a second specific embodiment, and FIG. 17 is an enlarged cross sectional view showing the conductive pad shown in FIG. 16. FIGS. 16 and 17 are equivalent to FIGS. 3 and 4 of the multilayer wiring board of the first embodiment. A multilayer wiring board 10' of the present embodiment when viewed in plane assumes a shape such as that of the multilayer wiring board 10 of the first embodiment shown in FIGS. 1 and 2.

In the multilayer wiring board 10' of the second embodiment, constituent elements that are the same or similar to those of the multilayer wiring board 10 of the first embodiment are assigned the same reference numerals.

The multilayer wiring board 10' of the present embodiment has the same configuration as that of the multilayer wiring board 10 of the first embodiment except that a barrier metal layer 63 made of a Ni/Au plating film, or the like, is formed between each of the second conductive pads 62 and the solder layer 64 so as to cover each of the second conductive pads 62 in their entirety.

As represented by the multilayer wiring board 10 of the first embodiment, when the solder layer 64 is formed so as to cover each of the second conductive pads 62 in their entirety, adhesion between the solder layer 64 and the second resist layer 42 decreases. For this reason, peeling often occurs between the solder layer 64 and the second resist layer 42 prior to or subsequent to flip-chip bonding of the multilayer wiring board 10 to a semiconductor element, which in turn causes a defective connection to the semiconductor element, or the like.

However, when the barrier metal layer 63 is formed between each of the second conductive pads 62 and the solder layer 64 in the manner mentioned above, adhesion of the barrier metal layer 63 to the second resist layer 42 is sufficiently superior to adhesion of the solder layer 64 to the second resist layer 42. Moreover, a coating thickness t1 of the barrier metal layer 63 formed over the side end face 62B of each second conductive pad 62 situated on the second resist layer 42 may be made greater than a coating thickness t2 of the barrier metal layer 63 formed on the surface 62A of each second conductive pad 62 situated higher than the side end face 62B. Therefore, enhancement of adhesion becomes more noticeable.

Therefore, peeling is minimized or eliminated between the barrier metal layer 63 and the second resist layer 42 prior to and subsequent to flip-chip bonding of the multilayer wiring board 10' to a semiconductor element. As a consequence, peeling is minimized or eliminated between the solder layer 64 and the second resist layer 42. Therefore, occurrence of a defective connection to a semiconductor element, or the like, can be prevented.

In relation to control of the thickness of the barrier metal layer 63 mentioned above, when the barrier metal layer 63 is formed over each of the second conductive pads 62 by means of, for instance, plating, a plating fluid is caused to stay on the side end face 62B of each second conductive pad 62 situated on the second resist layer 42 to thus make it possible to make the coating thickness t1 of the barrier metal layer 63 situated on the side end face 62B larger than the coating thickness t2 of the barrier metal layer 63 formed on the surface 62A of each of the second conductive pads 62 situated at a higher position than the side end face 62B.

In the embodiment, the solder layer 64 is formed only over the barrier metal layer 63 to thus prevent the solder layer 64 from contacting the second resist layer 42. Accordingly, it is possible to prevent an end of the solder layer 64 remaining in contact with the second resist layer 42 from being partially peeled.

Since the multilayer wiring board 10' of the present embodiment is identical with its counterpart multilayer wiring board 10 of the first embodiment in another characteristic and advantages, the same explanations are given to them.

Method for Manufacturing the Multilayer Wiring Board

A method for manufacturing the multilayer wiring board 10' of the second embodiment utilizes a layered product 10b formed through processes, such as those shown in FIGS. 1 through 15. Subsequently, the first resist layer 41 having the openings 41A, such as openings through which the first conductive pads 61 of the layered product 10b become exposed, is formed. Further, the barrier metal layer 63 is formed by plating so as to cover each of the second conductive pads 62 in their entirety. The solder layer 64 is then formed, whereby the multilayer wiring board 10', such as that shown in FIGS. 16 and 17, is formed.

When the coating thickness t1 of the barrier metal layer 63 situated on the side end face 62B is made greater than the coating thickness t2 of the barrier metal layer 63 formed over the surface 62A of each of the second conductive pads 62 situated higher than the side end face 62B, a plating fluid is caused to stay on the side end face 62B of each second conductive pad 62 situated on the second resist layer 42.

Although the present invention has been described in detail by reference to the specific examples, the present invention is not confined to the specifics mentioned above. The present invention will be susceptible to every possible modifications and alterations without departing from the scope of the present invention.

What is claimed is:

1. A multilayer wiring board comprising:
   a build-up layer including a conductor layer and a resin insulation layer that are alternately layered;
   a conductive pad formed so as to project from a surface of the resin insulation layer and having an upper surface, the upper surface having an outer periphery portion and a center portion recessed relative to the outer periphery portion;
   a solder layer formed on the conductive pad so that the solder layer over the upper surface of the conductive pad is situated above a level defined by the outer periphery portion; and
   a barrier metal layer formed between the conductive pad and the solder layer so as to cover the entire conductive pad;
   wherein:
      the solder layer covers the conductive pad and the barrier metal layer that covers the conductive pad in its entirety; and
      a coating thickness of the barrier metal layer formed on a side end face of the conductive pad situated on the resin insulation layer is made greater than a coating thickness of the barrier metal layer formed on the surface of the conductive pad situated at a higher position than the side end face.

2. The multilayer wiring board according to claim 1, wherein the upper surface of the conductive pad forms a continual curved surface.

3. The multilayer wiring board according to claim 1, wherein the solder layer covers a side surface of the conductive pad.

4. A multilayer wiring board comprising:
   a build-up layer including a conductor layer and a resin insulation layer that are alternately layered;
   a conductive pad formed so as to project from a level defined by a top end surface of the resin insulation layer, the conductive pad having an upper surface that includes an outer periphery portion and a center portion recessed relative to the outer periphery portion; and
   a solder layer formed on the conductive pad so that the solder layer over the upper surface of the conductive pad is situated above a level defined by the outer periphery portion.

* * * * *